(12) United States Patent
Hirose et al.

(10) Patent No.: US 7,701,225 B2
(45) Date of Patent: Apr. 20, 2010

(54) DIELECTRIC STRENGTH TEST METHOD OF SUPERCONDUCTING CABLE

(75) Inventors: Masayuki Hirose, Osaki (JP); Ken Yatsuka, Osaki (JP); Hiroshi Takigawa, Osaki (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 445 days.

(21) Appl. No.: 11/664,608

(22) PCT Filed: Oct. 12, 2005

(86) PCT No.: PCT/JP2005/018749

§ 371 (c)(1),
(2), (4) Date: Apr. 4, 2007

(87) PCT Pub. No.: WO2006/073016

PCT Pub. Date: Jul. 13, 2006

(65) Prior Publication Data

US 2008/0039334 A1    Feb. 14, 2008

(30) Foreign Application Priority Data

Jan. 7, 2005    (JP)    ............................. 2005-003192

(51) Int. Cl.
G01R 31/02    (2006.01)
G01R 27/08    (2006.01)
C04B 35/45    (2006.01)

(52) U.S. Cl. ..................... 324/544; 324/691; 505/310

(58) Field of Classification Search .................. 324/544, 324/691; 505/310
See application file for complete search history.

(56) References Cited

U.S. PATENT DOCUMENTS 5,854,556 A * 12/1998 Steennis et al. ............. 324/541

(Continued)

FOREIGN PATENT DOCUMENTS

| JP | 56-102481 | 8/1981 |
| JP | 6-325629 | 11/1994 |
| JP | 2001-325839 | 11/2001 |

(Continued)

OTHER PUBLICATIONS

Transmittal of Copies of Translation of the International Preliminary Report on Patentability, Written Opinion and International Search Report (8 pages).

*Primary Examiner*—Jeff Natalini
(74) *Attorney, Agent, or Firm*—Foley & Lardner LLP

(57) ABSTRACT

A dielectric strength test method of a superconducting cable that can evaluate the insulation characteristic of a superconducting cable in a state in which a refrigerant is filled without filling a refrigerant is provided.

A tested superconducting cable is filled with gas in place of a refrigerant and a regular dielectric strength test is conducted at room temperature. Preferably, a preliminary dielectric strength test is conducted prior to the regular dielectric strength test. In the preliminary dielectric strength test, a first reference superconducting cable filled with a refrigerant at a predetermined pressure and a second reference superconducting cable filled with gas in place of a refrigerant at a predetermined pressure are provided. The preliminary dielectric strength test is conducted for the first reference superconducting cable at refrigerant temperature and the second reference superconducting cable at room temperature to find the correlation between the dielectric strength characteristics of the cables. At the time, the test voltage is determined based on the dielectric strength characteristic of the second reference superconducting cable. The regular dielectric strength test is conducted at the test voltage.

10 Claims, 2 Drawing Sheets

U.S. PATENT DOCUMENTS

| | | | |
|---|---|---|---|
| 6,211,467 B1 * | 4/2001 | Berelsman et al. | 174/113 R |
| 6,718,618 B2 * | 4/2004 | Hirose et al. | 29/599 |
| 2003/0127492 A1 * | 7/2003 | Ayai et al. | 228/4.5 |
| 2007/0084623 A1 * | 4/2007 | Yamaguchi | 174/125.1 |

FOREIGN PATENT DOCUMENTS

| | | |
|---|---|---|
| JP | 2003-9330 | 1/2003 |
| JP | 2003-31049 | 1/2003 |

* cited by examiner

DIELECTRIC STRENGTH TEST METHOD OF SUPERCONDUCTING CABLE

TECHNICAL FIELD

This invention relates to a dielectric strength test method of a superconducting cable. It relates in particular to a test method capable of evaluating the dielectric strength characteristic of a superconducting cable without filling a refrigerant.

BACKGROUND ART

For normal conducting cables of an OF cable, a POF cable, a CV cable, etc., a sample test using a spot sample and a frame test applied to the full length of a product are conducted as a method of checking the insulation performance of each cable.

The former is intended for checking to see if no problem arises if a voltage is continuously applied to the cable for a long time or checking to see if the cable has a predetermined insulation performance against a lightning surge on a spot sample.

In contrast, the latter is intended for checking that the cable has sufficient performance for system power-frequency overvoltage at the full length without damage to the cable as a shipment test.

In other words, it can be said that a check is made on the sample test to ensure that the cable manufacturing condition does not involve any problem and a check is made on the frame test to ensure that the manufacturing condition is carried out reliably at the full length of the cable.

On the other hand, research of a superconducting cable is made toward practical utilization. By way of example, a polyphase superconducting cable of multicore batch type having a plurality of cable cores in batch is proposed (for example, patent document 1: JP-A-2003-9330 at FIG. 5). FIG. 1 is a sectional view of a three-phase superconducting cable of three-core batch type. The superconducting cable 100 has three cable cores 110 twisted and stored in a heat insulation tube 120.

The heat insulation tube 120 is implemented as a double tube made up of an inner tube 121 and an outer tube 122 and has a heat insulation material (not shown) between both the tubes with the gap evacuated. Each cable core 110 includes a former 10, a conductor layer 20, an insulating layer 30, a shield layer 40, and a protective layer 50 from the center to the outside. The conductor layer 20 is formed by spirally winding multiple layers of a superconducting wire around the former 10, and the insulating layer 30 is formed by winding semi-synthetic insulating paper. The shield layer 40 is formed by spirally winding a superconducting wire like that of the conductor layer 20 around the insulating layer 30. A refrigerant such as liquid nitrogen is filled into and circulated in the former 10 and the space formed between the inner tube 121 and the core 110 and the insulating layer is impregnated with refrigerant; this state is the use stage of the cable.

However, since the superconducting cable is not filled with a refrigerant at factory shipment, a method of appropriately testing the insulating characteristic with the superconducting cable filled with a refrigerant is not established.

For example, for a POF cable, insulating paper forming the insulating layer of the cable core is impregnated with high-viscosity insulating oil and the cable is protected so that the insulating oil is hard to flow out into the outside and then a frame test is conducted in a factory. At this time, the insulating layer contains air. However, after shipment, the cable core is pulled into a steel pipe and low-viscosity oil is filled into the steel pipe and a high pressure is applied, whereby the air existing in the insulating layer is dissolved into the insulating oil for placing the cable in a state in which the cable has the essential insulating performance. Therefore, the POF cable has the insulating layer impregnated with the insulating oil at factory shipment and a frame test of the cable can be conducted in a state close to the use state of the cable.

On the other hand, the superconducting cable is not filled with a refrigerant at factory shipment and is subjected to termination treatment in the laying field and then a refrigerant is filled into and circulated in the superconducting cable for placing the cable in the normal use state. Thus, a significant frame test cannot be conducted at factory shipment at which the insulating characteristic largely differs from that at the use time. If it is assumed that a capital investment to fill and circulate a liquid refrigerant from both terminals of the superconducting cable is conducted and a frame test is conducted with the superconducting cable placed in a cool state before shipment, the capital investment amortization and the costs for cooling heavily increase the cost of the superconducting cable. If the superconducting cable is cooled in a state in which it is wound around a drum, a mechanical stress acts in a more severe bend state than in laying in the field and there is also a possibility that damage to the cable may occur.

It is therefore a principal object of the invention to provide a dielectric strength test method of a superconducting cable that can evaluate the insulation characteristic of a superconducting cable in a state in which a refrigerant is filled without filling a refrigerant.

Means For Solving the Problems

The invention accomplishes the object by simulating the dielectric strength characteristic of a superconducting cable at room temperature without filling a refrigerant into the superconducting cable to be tested.

A dielectric strength test method of a superconducting cable of the invention is characterized in that the tested superconducting cable is filled with gas in place of a refrigerant and a regular dielectric strength test is conducted at room temperature.

In this test method, only the regular dielectric strength test may be conducted and a preliminary dielectric strength test may be previously conducted. To conduct only the regular dielectric strength test, the tested superconducting cable is filled with gas in place of a refrigerant and the regular dielectric strength test is conducted at room temperature. At the time, a partial discharge test, a dielectric loss tangent (tan δ) measurement test, etc., can be named as representative examples of the regular dielectric strength test. As the test condition, for example, the voltage value with the dielectric strength characteristic at room temperature estimated based on the dielectric strength characteristic found in the tested superconducting cable when a refrigerant is filled may be adopted as the test voltage. The estimation voltage value may use the design value or may be found by calculation. If there is no problem in the dielectric strength test at room temperature at the test voltage, it is estimated that the cable satisfies a predetermined dielectric strength characteristic if a refrigerant is filled.

To conduct a preliminary dielectric strength test, first a first reference superconducting cable filled with a refrigerant at a predetermined pressure and a second reference superconducting cable filled with gas in place of a refrigerant at a predetermined pressure are provided. Subsequently, a preliminary dielectric strength test is conducted for the first reference superconducting cable at refrigerant temperature and the second reference superconducting cable at room temperature to find the correlation between the dielectric strength characteristics of the cables. On the other hand, in the regular dielectric strength test, the tested superconducting cable is filled with the gas at a predetermined pressure and the regular dielectric strength test is conducted at room temperature at the test voltage. The test voltage at the time is found based on the dielectric strength characteristic of the second reference superconducting cable. Further, the test voltage is a value considering a tolerance for the value based on the found dielectric strength characteristic. If the dielectric strength characteristic is satisfied in the regular dielectric strength test, it is evaluated that even the tested superconducting cable filled with refrigerant satisfies the dielectric strength characteristic.

The reference superconducting cables used for the preliminary dielectric strength test are normally manufactured superconducting cables; the reference superconducting cable filled with a refrigerant is the first reference superconducting cable and the reference superconducting cable filled with gas is the second reference superconducting cable. The refrigerant may be a gas refrigerant or a liquid refrigerant and usually spot samples may be used for the reference superconducting cables. Liquid nitrogen, liquid helium, liquid hydrogen, liquid oxygen, liquid fluorine, liquid argon, liquid air, liquid neon, etc., can be named as specific examples of the liquid refrigerant filled into the first reference superconducting cable. Nitrogen gas, helium gas, hydrogen gas, oxygen gas, fluorine gas, neon gas, argon gas, air, etc., can be named as specific examples of the gas refrigerant. Nitrogen gas or air, for example, can be used as the gas filled into the second reference superconducting cable.

A dielectric breakdown test can be used for the preliminary dielectric strength test. In the dielectric breakdown test, breakdown voltage is found. In addition, for example, a partial discharge test and a dielectric loss tangent (tan $\delta$) measurement test can be used. In the partial discharge test, generation voltage of partial discharge is found. In the dielectric loss tangent measurement test, the voltage at which tan $\delta$ increases (discharge starts) is found. Any of the dielectric breakdown test, the partial discharge test, or the dielectric loss tangent measurement test may be used as the preliminary dielectric strength test or the dielectric breakdown test, the partial discharge test, and the dielectric loss tangent measurement test may be used in combination as the preliminary dielectric strength test.

In the preliminary dielectric strength test, the dielectric strength characteristic is tested for the first reference superconducting cable at refrigerant temperature and the second reference superconducting cable at room temperature. Here, the refrigerant temperature refers to the temperature of the refrigerant at the time of the cooling temperature suited for operating the superconducting cable. Of course, the dielectric strength characteristic may be tested at any temperatures other than the refrigerant temperature or the room temperature to grasp the relationship between the dielectric strength characteristics of the first and second reference superconducting cables in more detail and increase the number of reference data pieces used to determine the test voltage described later. The refrigerant or gas fill pressure basically is the actual use refrigerant pressure of the cable. The actual use refrigerant pressure generally is a higher pressure than atmospheric pressure (100 kPa); specifically it is a pressure of two atmospheres (300 kPa) or more. Of course, preferably, measurement at other pressures is also conducted together.

The test voltage is determined based on the dielectric strength characteristic of the second reference superconducting cable in the preliminary dielectric strength test. For example, if a dielectric breakdown test is conducted as the preliminary dielectric strength test, the breakdown voltage ratio between the first and second reference superconducting cables is found. The value resulting from multiplying the voltage (predetermined) of the regular dielectric strength test of the cable filled with a liquid refrigerant by the ratio may be adopted as the test voltage or a lower voltage value considering a tolerance than that value may be adopted as the test voltage. If a partial discharge test is conducted as the preliminary dielectric strength test, the partial discharge occurring voltage ratio between the first and second reference superconducting cables is found. The value resulting from multiplying the voltage (predetermined) of the regular dielectric strength test of the cable filled with a liquid refrigerant by the ratio may be adopted as the test voltage or a lower voltage value considering a tolerance than that value may be adopted as the test voltage. Further, if dielectric loss tangent measurement is conducted as the preliminary dielectric strength test, the voltage value when dielectric loss tangent measurement is conducted on the second reference superconducting cable or a lower voltage value considering a tolerance than that voltage value may be adopted as the test voltage.

Generally, there is a tendency to provide an excellent dielectric strength characteristic as the refrigerant or gas temperature is lower and the refrigerant or gas pressure is higher. Thus, the above-mentioned tolerance can be considered, for example, by adopting the dielectric strength characteristic value at a higher temperature than the actual use refrigerant temperature or the dielectric strength characteristic value at a lower pressure than the actual use refrigerant pressure as the test voltage.

On the other hand, the regular dielectric strength test applies to a tested superconducting cable. The tested superconducting cable is a superconducting cable having the same structure as the reference superconducting cable and is a cable whose dielectric strength characteristic is to be examined. Typically, the full length of a superconducting cable at shipment is adopted as the tested superconducting cable. Accordingly, the dielectric strength characteristic over the full length of the cable can be tested and the regular dielectric strength test can be conducted as a frame test.

The regular dielectric strength test can also use a dielectric breakdown test, a partial discharge test, or a dielectric loss tangent measurement test, for example. Since the preliminary dielectric strength test is a test to determine the test voltage in the regular dielectric strength test, the same test method as the preliminary dielectric strength test may be adopted in the regular dielectric strength test or a different test method may be adopted.

This means that the following main test method combinations are possible:

(1) A dielectric breakdown test is conducted as the preliminary dielectric strength test to determine the test voltage and a dielectric breakdown test is conducted as the regular dielectric strength test at the test voltage to check that a dielectric breakdown does not occur.

(2) A partial discharge test is conducted as the preliminary dielectric strength test to determine the test voltage and a partial discharge test is conducted as the regular dielectric strength test at the test voltage to check that partial discharge does not occur.

(3) A dielectric loss tangent measurement test is conducted as the preliminary dielectric strength test to determine the test voltage and a dielectric loss tangent measurement test is conducted as the regular dielectric strength test at the test voltage to check that tan $\delta$ is normal.

(4) A dielectric loss tangent measurement test and a partial discharge test are conducted as the preliminary dielectric strength test to determine the test voltage and a dielectric loss tangent measurement test is conducted as the regular dielectric strength test at the test voltage to check that tan δ is normal.

(5) A dielectric loss tangent measurement test and a partial discharge test are conducted as the preliminary dielectric strength test to determine the test voltage and a partial discharge test and a dielectric loss tangent measurement test are conducted as the regular dielectric strength test at the test voltage to check that partial discharge does not occur and that tan δ is normal.

For partial discharge measurement, as the cable becomes longer, the sensitivity of partial discharge worsens as being distant from the terminal and thus if the cable is long, preferably dielectric loss tangent measurement is selected. Partial discharge test and dielectric loss tangent measurement are used together, so that it is effective to evaluate a large defect such as foreign matters based on partial discharge and an inadequacy in the whole use material or manufacturing condition based on tan δ.

Advantages of the Invention

In the dielectric strength test method of a superconducting cable of the invention, the tested superconducting cable is filled with gas in place of a gas refrigerant or a liquid refrigerant and the regular dielectric strength test is conducted at room temperature, so that the dielectric strength test can be conducted without filling a refrigerant into the tested superconducting cable.

As the preliminary dielectric strength test, the dielectric strength characteristics obtained from the first and second reference superconducting cables are used to find the correlation between the dielectric strength characteristics of the reference superconducting cables wherein a refrigerant is filled and wherein gas is filled. The tested superconducting cable is filled with gas in place of a refrigerant and the dielectric strength test is conducted at room temperature and the dielectric strength characteristic when the cable is filled with a refrigerant can be simulated from the test result. Therefore, the regular dielectric strength test can be conducted at room temperature without filling a refrigerant into the cable and the dielectric strength characteristic when the cable is filled with a refrigerant can be estimated. Further, the dielectric strength test can be conducted without damage to the tested superconducting cable.

DESCRIPTION OF REFERENCE NUMERALS

Figure 1:
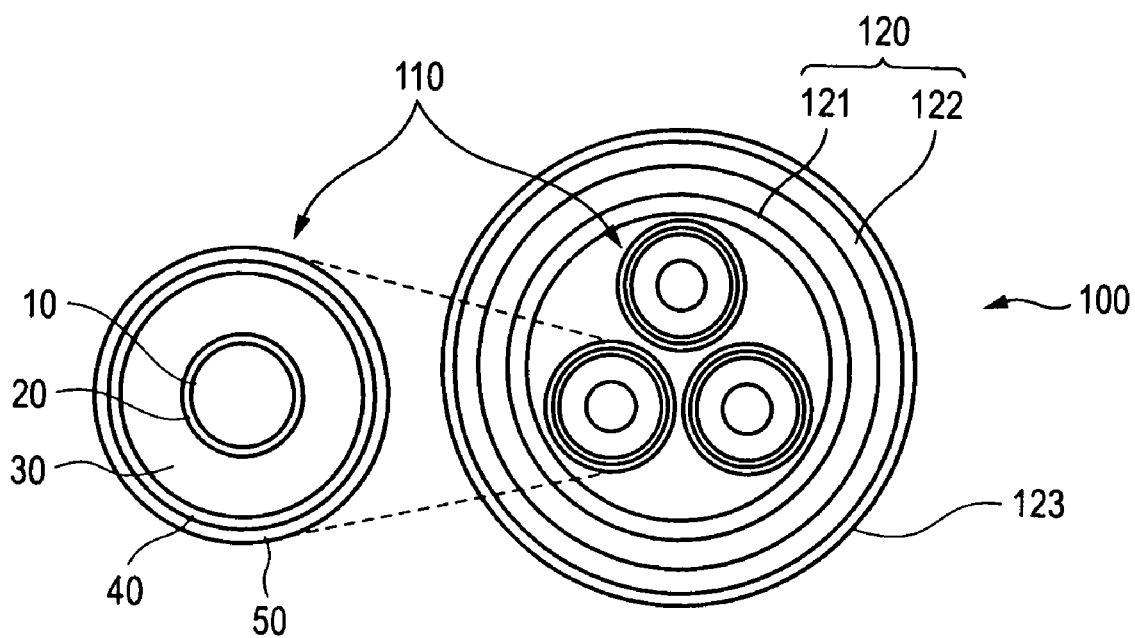
FIG. 1 is a sectional view of a superconducting cable used with a test method of the invention.

100 Superconducting cable
110 Core
10 Former
20 Conductor layer
30 Insulating layer
40 Shield layer
50 Protective layer
120 Heat insulation tube
121 Corrugated inner tube
122 Corrugated outer tube
123 Protective covering outer sheath

BEST MODE FOR CARRYING OUT THE INVENTION

An embodiment of the invention will be discussed below:

A three-core superconducting cable was manufactured as an example of a superconducting cable tested according to a test method of the invention. FIG. 1 is a sectional view of the superconducting cable.

The cable 100 is made up of three twisted cores 110 and a heat insulation tube 120 housing the cores. Each core 110 has a former 10, a conductor layer 20, an insulating layer 30, a shield layer 40, and a protective layer 50 from the center to the outside. The conductor layer 20 and shield layer 40 use each a superconducting wire.

A solid substance with metal wires twisted or a hollow substance using a metal pipe can be used for the former 10. A substance with a plurality of copper strands twisted can be named as an example of the solid former. As a former of a twisted line structure is adopted, a decrease in the AC loss and suppression of temperature rise in overcurrent can be accomplished at the same time. On the other hand, if a hollow former is used, the inside can be used as a refrigerant flow passage.

A tape wire with a plurality of oxide high-temperature superconducting filaments covered with a silver sheath is preferred for the conductor layer 20. Here, a Bi2223-family tape wire was used. Multiple layers of the tape wire are wound around the former to form the conductor layer 20. The layers of the conductor layer 20 differ in twist pitch of the superconducting wire. In addition, the winding direction is changed for each layer or every two or more layers, whereby the currents flowing into the layers can be uniformed.

The insulating layer 30 is formed on the outer periphery of the conductor layer 20. The insulating layer 30 can be formed by winding semisynthetic paper provided by laminating kraft paper and a resin film of polypropylene, etc., (PPLP manufactured by Sumitomo Electric Industries, LTD: Registered trademark), for example, around the outer periphery of the conductor 20.

If the cable is an AC superconducting cable, it is provided with the shield layer 40 on the outside of the insulating layer 30 for shielding magnetism. The shield layer 40 is formed by winding a superconducting wire similar to that used for the conductor layer 20 around the outside of the insulating layer 30. A current in an opposite direction in almost the same magnitude as the conductor layer 20 is induced into the shield layer 40, whereby occurrence of a magnetic field to the outside of the cable can be canceled.

Further, the protective layer 50 is formed on the shield layer 40. The protective layer 50 mechanically protects the inner structure from the shield layer 40 and is formed by winding Kraft paper or cloth tape around the shield layer 40.

The heat insulation tube 120 is of a double tube structure having a corrugated inner tube 121 and a corrugated outer tube 122. Usually, a space is formed between the corrugated inner tube 121 and the corrugated outer tube 122 and is evacuated. Superinsulation is placed in the evacuated space for reflecting radiation heat. A protective covering outer sheath 123 made of polyvinyl chloride, etc., is formed on the corrugated outer tube.

A refrigerant is filled into the heat insulation tube 120 to cool the conductor layer 20 and the shield layer 40 to a lower temperature than the critical temperature. A liquid refrigerant or a gas refrigerant is used as the refrigerant.

For example, liquid nitrogen, liquid helium, liquid neon, liquid hydrogen, etc., can be named as the liquid refrigerant. To use the liquid refrigerant as the refrigerant of the superconducting cable, the liquid refrigerant, the conductor layer 20, and the shield layer 40 reach heat balance promptly against heat generation of the cable components occurring when a large current is allowed to flow into the superconducting cable. Accordingly, the conductor layer 20 and the shield layer 40 are stably maintained at the temperature suited for operating the superconducting cable.

For example, helium gas, hydrogen gas, etc., can be named as the gas refrigerant. To use the gas refrigerant, the following advantages can be provided: (1) A problem of gasification involved in using a liquid refrigerant does not exist. (2) The pressure loss produced when the refrigerant is circulated can be lessened. (3) The temperature change width of the gas refrigerant (for example, the boiling point of hydrogen gas is about 20 K and the critical temperature of Bi2223 is about 105 K and thus the temperature change width has a tolerance of about 85K) is large as compared with the temperature change width of the liquid refrigerant (for example, the melting point and the boiling point of nitrogen are 63 K and 77 K respectively and the liquid refrigerant is gasified before the temperature rises to the critical temperature). This means that the gas refrigerant does not require strict temperature control.

EXAMPLE 1

<Preliminary Dielectric Strength Test>

A preliminary dielectric strength test is conducted using spot samples of superconducting cables normally manufactured with the structure described above. Here, a partial discharge test is conducted as the preliminary dielectric strength test. Each spot sample filled with liquid nitrogen (about 77 K) is a first reference superconducting cable and each spot sample filled with nitrogen gas at room temperature is a second reference superconducting cable. Further, a first reference superconducting cable filled with 150-K nitrogen gas is provided as a control example. A partial discharge test is conducted for the reference superconducting cables at the temperatures and under the pressure condition listed in Table 1 to find the voltage generated by partial discharge. The test method of the partial discharge test is in conformity with the method stipulated in IEC 60885-2 Ed.1.0:1987 (b). The test result is also listed in Table 1. Each numeric value with no unit in the table denotes partial discharge occurrence electric field value (kV/mm)

TABLE 1

| Absolute pressure | Temperature | | |
|---|---|---|---|
| | Room temperature | 150 K | 77 K |
| 100 kPa | 3.2 | 5.5 | 12 |
| 200 kPa | 4.8 | 8.9 | 24 |
| 300 kPa | 5.8 | 10.8 | — |
| 550 kPa | 10.8 | — | — |

From the result listed in the table, it is considered that water content contained in the insulating layer is frozen at the liquid nitrogen temperature (about 77 K) and the highest insulation characteristic is shown and therefore it is shown that the water content does not degrade the insulation performance.

Making a comparison between liquid nitrogen impregnation (77 K) and nitrogen gas filling (150 K), it is seen that as the dielectric constant of the fill target is small, the electric field of the gas portion becomes high and thus partial discharge occurs in nitrogen gas filling earlier than in liquid nitrogen impregnation and the insulating strength is also low.

Further, at room temperature, water content exists in the insulating layer and thus partial discharge occurs earlier and the insulating strength also furthermore lowers.

<Determination of Test Voltage>

It is considered that the superconducting cable operates at a refrigerant pressure of 300 kPa or more. Then, considering a tolerance, 5:1, the ratio between stress (24 kV/mm) with no partial discharge occurring at 200 kPa at 77 K and the stress at room temperature (4.8 kV/mm), is applied to a regular dielectric strength test.

<Regular Dielectric Strength Test>

In the regular dielectric strength test, the full length of each tested superconducting cable is tested. The tested superconducting cable has the same structure as the reference superconducting cable and is a cable filled with nitrogen gas at 200 kPa. A partial discharge test is conducted at room temperature for the tested superconducting cable. At the time, the voltage of the partial discharge test is one-fifth the frame test voltage of the superconducting cable filled with liquid nitrogen by applying the above-mentioned ratio, and a frame test is conducted for the full length of the cable. The test method of the partial discharge test is also in conformity with the method stipulated in IEC 60885-2 Ed.1.0:1987 (b). If partial discharge does not occur in the regular dielectric strength test, the tested superconducting cable is assumed to have the normal dielectric strength characteristic for shipment.

The test method as described above is effective particularly when the insulating layer of the superconducting cable is semisynthetic paper typified by PPLP. Since Kraft paper contains water content in the air unless it is impregnated with insulating oil, the insulating strength extremely lowers. In contrast, to use PPLP, a resin layer of polypropylene exists and the occupation percentage of Kraft paper in the insulating layer lessens, so that variations in the dielectric strength characteristic caused by the effect of the water content contained in the Kraft paper can be suppressed. Consequently, the partial discharge occurrence level difference occurring because the condition of a bad gap part (gap disorder between turns of PPLP wound around the insulating layer) differs can be made obvious.

MODIFIED EXAMPLE 1

In the example described above, the partial discharge occurrence electric field value of the liquid nitrogen filled into the first reference superconducting cable is referenced when the voltage applied to the regular dielectric strength test is determined. However, in the preliminary dielectric strength test, the liquid nitrogen may be replaced with hydrogen gas cooled to the temperature suited for operating the superconducting cable and the partial discharge occurrence electric field value in the hydrogen gas may be referenced for determining the voltage applied to the regular dielectric strength test. In this case, considering a tolerance, the ratio between the stress with no partial discharge occurring at 200 kPa at the temperature suited for operating the superconducting cable of the hydrogen gas and the stress at 200 kPa at room temperature is applied to the regular dielectric strength test, as in the example described above. According to the measurement value, the voltage of the partial discharge test used for the regular dielectric strength test is determined based on the above-mentioned ratio and a frame test for the full length of the cable is conducted. If partial discharge does not occur in the regular dielectric strength test, the tested superconducting cable is assumed to have the normal dielectric strength characteristic for shipment.

MODIFIED EXAMPLE 2

In the example described above, the preliminary dielectric strength test and the regular dielectric strength test are each a partial discharge test. However, the preliminary and regular dielectric strength tests may be replaced each with a dielectric loss tangent measurement test or may use each a partial discharge test and a dielectric loss tangent measurement test in combination. Or, the preliminary dielectric strength test may use a partial discharge test and a dielectric loss tangent measurement test in combination and a dielectric loss tangent measurement test may be conducted only for the regular dielectric strength test. For example, a dielectric loss tangent measurement test can be adopted for both the preliminary and regular dielectric strength tests and tan δ of the tested superconducting cable can be compared with tan δ of the reference superconducting cable to check that tan δ of the tested superconducting cable is normal. Or, a dielectric loss tangent measurement test and a partial discharge test can be adopted for the preliminary dielectric strength test, the test voltage can be determined from the result of the partial discharge test, and a dielectric loss tangent measurement test and a partial discharge test can be conducted as the regular dielectric strength test at the determined test voltage to check that tan δ is normal and that partial discharge does not occur.

EXAMPLE 2

Next, the case where a dielectric loss tangent measurement test is conducted as the preliminary dielectric strength test and the regular dielectric strength test will be discussed.

Also in the example, the dielectric loss tangent of a first reference superconducting cable filled with liquid nitrogen and the dielectric loss tangent of a second reference superconducting cable filled with nitrogen gas are previously measured as the preliminary dielectric strength test as in the example 1. The dielectric loss tangent measurement test was conducted based on JIS high-voltage test method.

Figure 2:
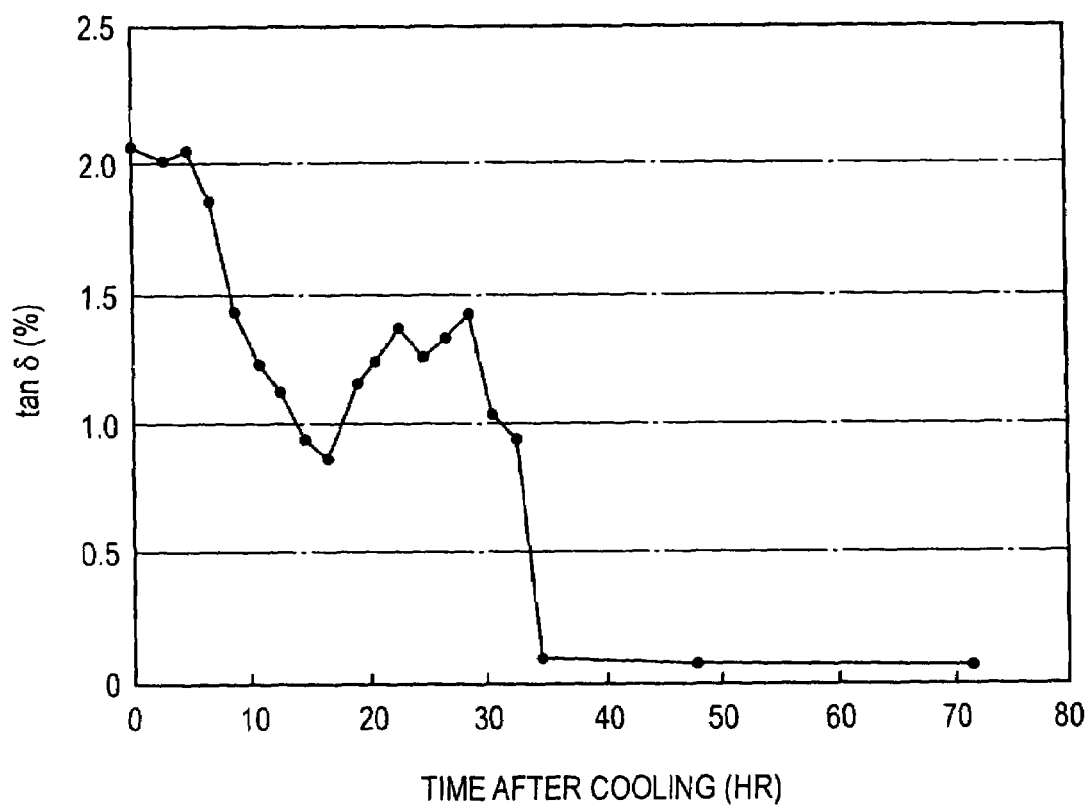
FIG. 2 is a graph to show the relationship between the time since starting to cool a superconducting cable filled with nitrogen gas and tan δ.

FIG. 2 is a graph to show the relationship between the time since starting to cool a superconducting cable filled with nitrogen gas and tan δ. As is evident from the graph, if the time after cooling starts is 0, namely, if nitrogen gas is filled at room temperature, high tan δ is shown. On the other hand, tan δ lowers with the passage of cooling time and becomes almost a constant value at liquid nitrogen temperature after the expiration of a given time.

Next, the regular dielectric strength test is conducted for a tested superconducting cable. A dielectric loss tangent measurement test is also conducted as the dielectric strength test. The test voltage at the time is the voltage in measurement on the second reference superconducting cable in the preliminary dielectric strength test.

If tan δ is normal as a result of conducting the regular dielectric strength test for the tested superconducting cable, namely, if the value of tan δ is almost 2.0%, it is evaluated that the tested superconducting cable has a predetermined dielectric strength characteristic if the cable is filled with liquid nitrogen.

MODIFIED EXAMPLE

In the example 2 described above, the first reference superconducting cable filled with liquid nitrogen was used for the preliminary dielectric strength test, but hydrogen gas may be used in place of the liquid nitrogen. In this case, among the components in the example 2, the refrigerant filled into the first reference superconducting cable is replaced with hydrogen gas cooled to the temperature suited for operating the superconducting cable and other components and measurement method are in conformity with those in the example 2. If tan δ is normal as a result of conducting the regular dielectric strength test for the tested superconducting cable, it is evaluated that the tested superconducting cable has a predetermined dielectric strength characteristic if the cable is filled with the nitrogen gas.

While the invention has been described in detail with reference to the specific embodiment, it will be obvious to those skilled in the art that various changes and modifications can be made without departing from the spirit and the scope of the invention.

The present application is based on Japanese Patent Application (No. 2004-190222) filed on Jun. 28, 2004 and Japanese Patent Application (No. 2005-003192) filed on Jan. 7, 2005, which are incorporated herein by reference.

INDUSTRIAL APPLICABILITY

The dielectric strength test method of a superconducting cable of the invention can be preferably used particularly for a frame test at shipment of a superconducting cable. At the time, the superconducting cable may be a multi-core superconducting cable or a single-core superconducting cable or may be AC or DC.

The invention claimed is:

1. A dielectric strength test method of a superconducting cable, characterized in that a tested superconducting cable is filled with gas in place of a refrigerant and a regular dielectric strength test is conducted at room temperature, wherein the test method comprises the steps of:
    providing a first reference superconducting cable filled with a refrigerant at a predetermined pressure and a second reference superconducting cable filled with gas in place of a refrigerant at a predetermined pressure;
    conducting a preliminary dielectric strength test for the first reference superconducting cable at refrigerant temperature and the second reference superconducting cable at room temperature to find a correlation between dielectric strength characteristics of the cables;
    finding test voltage based on the dielectric strength characteristic of the second reference superconducting cable;
    conducting a regular dielectric strength test for the tested superconducting cable at the test voltage; and
    evaluating that even the tested superconducting cable filled with refrigerant satisfies the dielectric strength characteristic if the dielectric strength characteristic is satisfied in the regular dielectric strength test.

2. The dielectric strength test method of a superconducting cable as claimed in claim 1, characterized in that the superconducting cable is cooled with a liquid refrigerant at an operating time.

3. The dielectric strength test method of a superconducting cable as claimed in claim 1, characterized in that the superconducting cable is cooled with a gas refrigerant at an operating time.

4. The dielectric strength test method of a superconducting cable as claimed in claim 1, characterized in that the test voltage is a value considering a tolerance for the dielectric strength characteristic of the second reference superconducting cable.

5. The dielectric strength test method of a superconducting cable as claimed in claim 1, characterized in that the preliminary dielectric strength test is a partial discharge test and that the test voltage is determined based on the result of the partial discharge test.

6. The dielectric strength test method of a superconducting cable as claimed in claim 5, characterized in that a dielectric loss tangent (tan δ) measurement test is also conducted in the preliminary dielectric strength test.

7. The dielectric strength test method of a superconducting cable as claimed in claim 1, characterized in that the preliminary dielectric strength test is a dielectric loss tangent (tan δ) measurement test and that the test voltage is determined based on an measurement condition when the dielectric loss tangent was found.

8. The dielectric strength test method of a superconducting cable as claimed in claim 1, characterized in that a partial discharge test is conducted in the regular dielectric strength test.

9. The dielectric strength test method of a superconducting cable as claimed in claim 1, characterized in that a dielectric loss tangent (tan δ) measurement test is conducted in the regular dielectric strength test.

10. The dielectric strength test method of a superconducting cable as claimed in claim 1, characterized in that the regular dielectric strength test is a shipment test for the full length of the tested superconducting cable.

* * * * *